(12) United States Patent
Kirsch

(10) Patent No.: US 6,771,998 B2
(45) Date of Patent: Aug. 3, 2004

(54) METHOD FOR THE OPERATION OF A MAGNETIC RESONANCE APPARATUS

(75) Inventor: Rainer Kirsch, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 63 days.

(21) Appl. No.: 10/068,410

(22) Filed: Feb. 6, 2002

(65) Prior Publication Data

US 2002/0107441 A1 Aug. 8, 2002

(30) Foreign Application Priority Data

Feb. 6, 2001 (DE) .......................................... 101 05 388

(51) Int. Cl.⁷ ................................................. A61B 5/05
(52) U.S. Cl. ....................... 600/410; 600/407; 600/529; 382/128; 324/307; 324/309; 324/310; 324/311
(58) Field of Search ................................. 600/407, 410, 600/529; 382/128; 324/307, 309, 310, 311

(56) References Cited

U.S. PATENT DOCUMENTS

| | | | | |
|---|---|---|---|---|
| 4,905,699 A | * | 3/1990 | Sano et al. .................. | 600/413 |
| 5,088,501 A | | 2/1992 | Niewisch | |
| 5,233,302 A | * | 8/1993 | Xiang et al. ................. | 324/309 |
| 5,539,312 A | | 7/1996 | Fu et al. | |
| 5,800,354 A | | 9/1998 | Hofland et al. | |
| 6,297,633 B1 | * | 10/2001 | Heid ........................... | 324/309 |
| 6,556,855 B2 | * | 4/2003 | Thesen ........................ | 600/419 |
| 6,559,641 B2 | * | 5/2003 | Thesen ........................ | 324/307 |
| 6,573,717 B2 | * | 6/2003 | Thesen ........................ | 324/307 |
| 2003/0164701 A1 | * | 9/2003 | Wang .......................... | 324/307 |

FOREIGN PATENT DOCUMENTS

| | | |
|---|---|---|
| EP | 0 909 958 | 4/1999 |
| WO | WO 98/47015 | 10/1998 |

OTHER PUBLICATIONS

"Prospective Multiaxial Motion Correction for fMRI", Ward et al., Magnetic Resonance in Medicine, vol. 43, (2000), pp. 459–469.

* cited by examiner

*Primary Examiner*—Angela D. Sykes
*Assistant Examiner*—William C. Jung
(74) *Attorney, Agent, or Firm*—Schiff Hardin LLP

(57) ABSTRACT

In a method for the operation of a magnetic resonance apparatus having a gradient system and a radio-frequency system that, among other things, are utilized for location coding of magnetic resonance signals, magnetic resonance signals from at least parts of a region of an examination subject to be imaged are acquired in a time sequence, and a deformation of the region to be imaged occurring during the time sequence is identified and the location coding is adapted according to the identified deformation.

11 Claims, 4 Drawing Sheets

METHOD FOR THE OPERATION OF A MAGNETIC RESONANCE APPARATUS

BACKGROUND OF THE INVENTION

1. Field of the Invention

The present invention is directed to a method for the operation of a magnetic resonance apparatus having a gradient system and a radio-frequency system that, among other things, are utilized for location coding of magnetic resonance signals, whereby magnetic resonance signals from at least parts of a region of an examination subject to be imaged are acquired in a time sequence.

2. Description of the Prior Art

Magnetic resonance technology is a known technique for acquiring images of the inside of the body of a subject to be examined. In a magnetic resonance apparatus, rapidly switched gradient fields that are generated by a gradient system of the apparatus are superimposed on a static basic magnetic field. For triggering magnetic resonance signals, further, radio-frequency signals are emitted into the examination subject, which trigger magnetic resonance signals that are picked up, and image data sets and magnetic resonance images are produced on the basis of the picked-up signals. The magnetic resonance signals that are picked up are demodulated in phase-sensitive fashion and are converted into complex quantities by sampling and analog-to-digital conversion. The complex quantities are entered in a k-space matrix from which a magnetic resonance image can be reconstructed with a multi-dimensional Fourier transformation.

Among other things, the gradient fields are used for location coding, i.e., the gradient fields make the contributions of individual voxels of a region of the examination subject to be imaged distinguishable in the registered magnetic resonance signal. To that end, the gradient fields are used in combination with the radio-frequency signals for selective excitation of a prescribable region of the examination subject, for example a slice, and also are used for the spatial coding within an excited region, for example a slice or a larger volume.

Generating magnetic resonance images free of motion artifacts requires an identical geometrical positioning of the region to be imaged over an entire exposure time span. Particularly for in vivo imaging, physiological movements as are caused by a heart action, respiration and/or a peristaltic of organs, oppose this requirement. For eliminating artifacts as a consequence of respiratorial movements, for example, magnetic resonance signals are only excited and/or registered during a reproducible respiratory phase. It is also known to retrospectively correct magnetic resonance images registered independently of the respiratory movement according to a time curve of the respiratory movement. In both techniques, the respiratory movement must be acquired, for example, with a respiration belt according to German OS 39 35 083 with which the respiratory movement is converted into a pressure signal that is forwarded via a pressure tube to an optical pressure sensor.

In functional magnetic resonance imaging, for example, three-dimensional image data sets of the brain are registered every two through four seconds, frequently with an echo planar method. After many image data sets have been registered at various points in time, the image data sets are compared to one another for signal differences for identifying active brain areas in order to form images referred to as activation images. The slightest positional changes of the brain during an overall exposure time span of the functional magnetic resonance imaging thereby lead to undesired signal differences that mask the sought brain activation.

In one embodiment of a functional magnetic resonance imaging, a correlation referred to as prospective motion correction is implemented during an executive sequence of the functional magnetic resonance imaging. To that end, positional changes which may have occurred, i.e. rotations and translations, of the region to be imaged are acquired from image data set registration-to-image data set registration, for example, on the basis of orbital navigator echos, and the location coding is adapted during the executive sequence for compensating the acquired positional changes.

An orbital navigator echo is registered just like a magnetic resonance signal generated for imaging, and the complex-number values thereof are entered in a navigator echo matrix as data points in k-space, with the data points forming a circular k-space path. A positional change between the points in time can be detected on the basis of orbital navigator echos that are generated at different points in time. To that end, a navigator echo is registered, for example, before every registration of an image data set, and the resulting navigator echo matrix is compared to a reference navigator echo matrix for identifying a positional change.

As is known, there is a linkage between image space and k-space via the multi-dimensional Fourier transformation. A translation of the region to be imaged in image space is expressed—according to the shift rule of Fourier transformation—as a modified phase of complex-number values in the associated k-space matrix of the region to be imaged. A rotation of the region to be imaged in image space causes the same rotation of the associated k-space matrix. In order to decouple a rotation from a translation in k-space, only magnitudes of the complex-number values are considered for rotations. Compared to a reference point in time, thus, a rotation of the region to be imaged can be determined by comparing magnitude values of the navigator echo matrix to those of the reference navigator echo matrix. The phase values are compared for determining a translation. The location coding is correspondingly adapted for compensating for a positional change identified in this way for an image data set to be subsequently registered. Because the occupation of k-space matrices in magnetic resonance technique can be directly controlled by the gradient fields, translations and rotations of the region to be imaged can be directly compensated—according to the rules of Fourier transformation—by an appropriately modified gradient field setting. The same applies for selective excitation of a prescribable region of the examination subject.

Respective orbital navigator echos are generated in three planes orthogonal relative to one another for identifying arbitrary positional changes in three-dimensional space. The article by H. A. Ward et al., "Prospective Multiaxial Motion Correction for fMRI", Magnetic Resonance in Medicine 43 (2000), pages 459 through 469, an example of a discussion of the above-described use of orbital navigator echos.

SUMMARY OF THE INVENTION

An object of the present invention is to provide a method for operating a magnetic resonance apparatus with which, among other things, a magnetic resonance image can be registered free of artifacts as a consequence of deformations of a region to be imaged.

This object is achieved in a method according to the invention for operating a magnetic resonance apparatus having a gradient system and a radio-frequency system that, among other things, are utilized for location coding of magnetic resonance signals, wherein magnetic resonance signals from at least parts of a region of an examination subject to be imaged are acquired in a time sequence, and wherein a deformation of the region to be imaged occurring during the time sequence is identified and the location coding is adapted according to the identified deformation.

Without retrospective correction, magnetic resonance images of a deformed region to be imaged can be registered which are free of artifacts as a consequence of the deformations.

In an embodiment, the deformation is identified with a navigator echo technique. As a result, utilization of a respiratory belt for acquiring the respiratory movement is not needed to identify a deformation that is produced by respiration of the examination subject.

DESCRIPTION OF THE PREFERRED EMBODIMENTS

Figure 1:
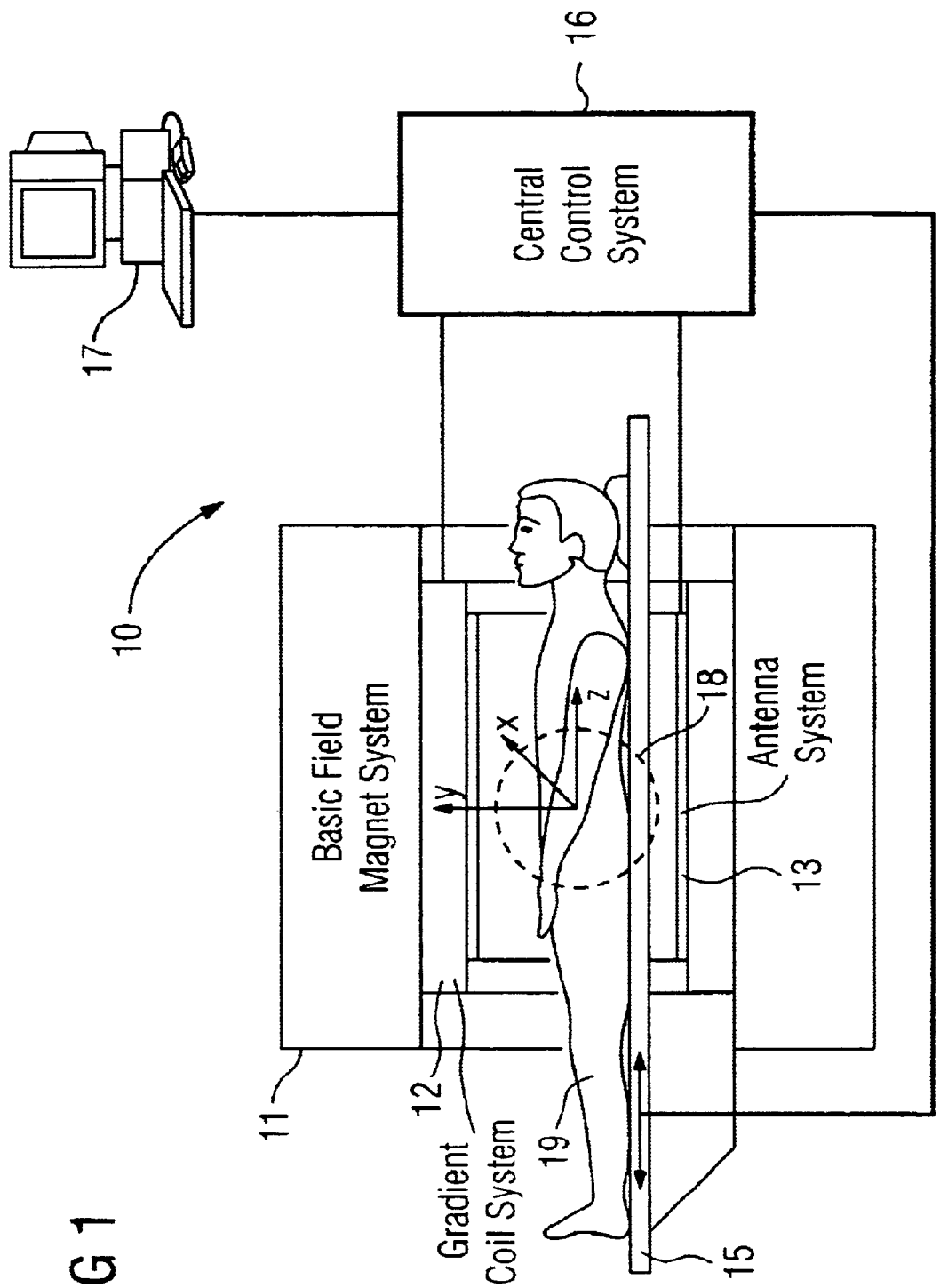
FIG. 1 is a schematic illustration of a magnetic resonance apparatus operable according to the inventive method.

FIG. 1 shows a magnetic resonance apparatus 10. The apparatus 10 has a basic field magnet system 11 for generating a basic magnetic field and comprises a gradient coil system 12 for generating gradient fields. Further, the apparatus 10—as a component of a radio-frequency system—an antenna system 13 that emits radio-frequency signals into an examination subject for triggering magnetic resonance signals, and that picks up the magnetic resonance signals that are generated. The apparatus 10 further has a displaceable support mechanism 15 on which the examination subject, for example a patient 19 to be examined, is borne.

The gradient system 12 is connected to a central control system 16 for controlling currents in the gradient coil system 12 on the basis of a sequence. For controlling the radio-frequency signals to be emitted in conformity with the sequence as well as for further-processing and storage of the magnetic resonance signals picked up by the antenna system 13, the antenna system 13 is likewise connected to the central control system 16. For controlling displacement of the support mechanism 15, for example in order to position a region in the abdomen and/or thorax of the patient 19 to be imaged in an imaging volume 18 of the apparatus, the mechanism 15 is also correspondingly connected to the central control system 16. The central control system 16 is connected to a display and operating device 17 via which inputs of an operator, for example the desired sequence type and sequence parameters, are supplied to the central control system 16. Further, the magnetic resonance images, among other things, are displayed at the display and operating device 17.

Figure 2:
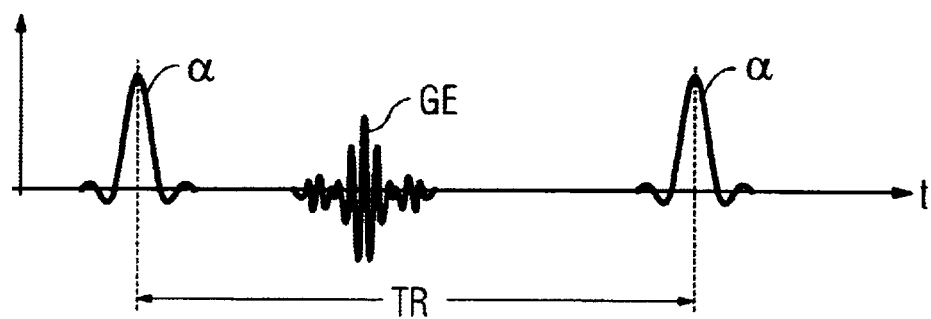
FIG. 2 shows a pulse sequence and gradient sequence of a spoiled radio echo sequence.
Figure 2:
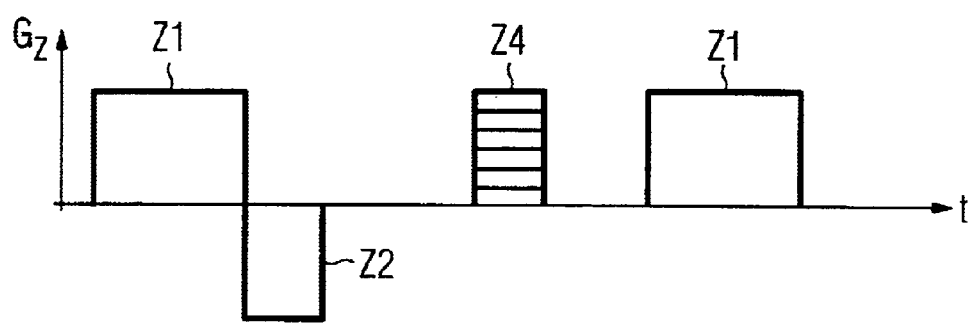
Figure 2:
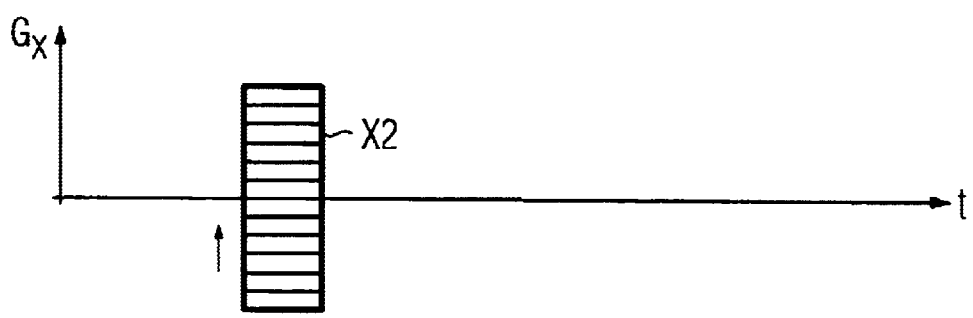
Figure 2:
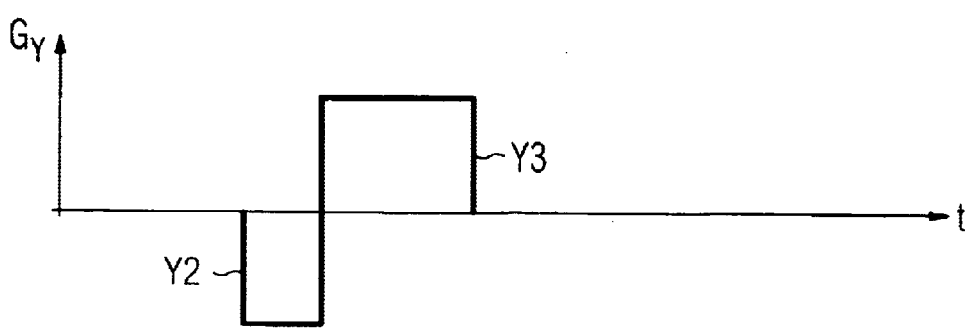

FIG. 2 shows a pulse pattern and gradient pattern of a spoiled gradient echo sequence. Radio-frequency signals a and a gradient echo signal GE as well as curves of a gradient intensity and slice selection gradient $G_z$ in the z-direction, a phase code gradient $G_x$ in the x-direction, and a frequency coding gradient $G_y$ in the y-direction are shown over time t. For selecting a slice, for example an abdominal slice of the patient 19 parallel to the x-y-plane, the slice selection gradient $G_z$ is first activated according to a gradient pulse Z1 and a radio-frequency signal a is simultaneously emitted by the antenna system 13 for radio-frequency excitation of the selected slice. Following directly, the slice selection gradient $G_z$ corresponding to the gradient pulse Z2 is activated for re-phasing, the phase coding gradient $G_x$ corresponding to a gradient pulse X2 is activated for phase coding, and the frequency coding gradient $G_y$ corresponding to the gradient pulse Y2 is activated for preparing the gradient echo signal GE. Following immediately, the frequency coding gradient $G_y$ is activated corresponding to the gradient pulse Y3 for generating the gradient echo signal GE as well as for the frequency coding. The gradient echo signal GE is picked up by the antenna system 13, and is demodulated in phase-sensitive fashion, and is converted into complex-number values by sampling an analog-to-digital conversion. These values are entered into and stored as data points in a line of a two-dimensional k-space matrix. After this data acquisition, finally, the slice selection gradient $G_z$ corresponding to the gradient pulse Z2 is activated as a spoiler for destroying any transverse magnetization that is still present. For filing each of a number of rows of the k-space matrix, the above-described pulse pattern and gradient pattern is repeated with a repetition term TR. The phase coding gradient $G_x$ is activated with a different gradient intensity per repetition.

Figure 3:
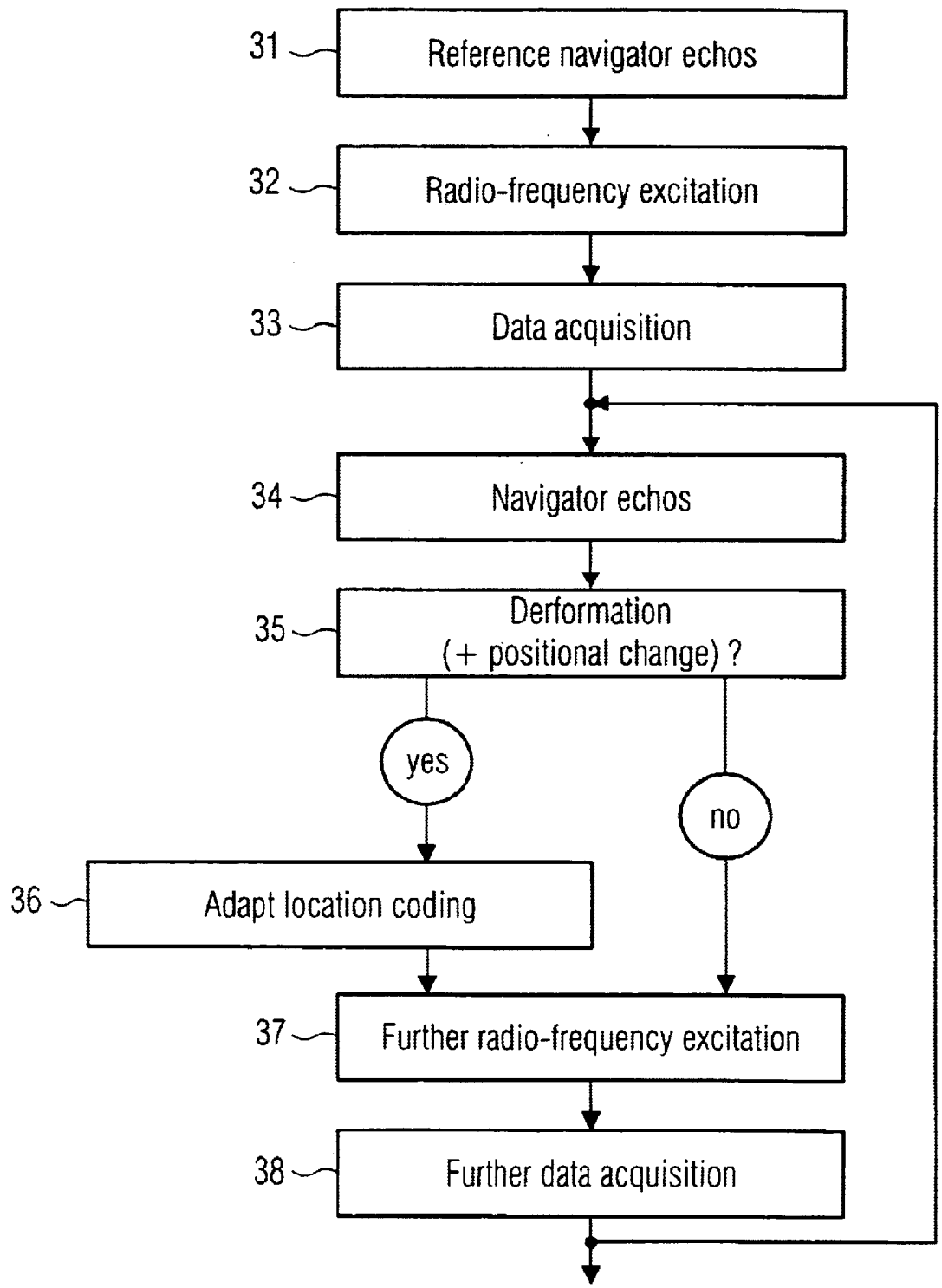
FIG. 3 is a flow chart of an embodiment of the inventive method for operating a magnetic resonance apparatus.

As an exemplary embodiment of the invention, FIG. 3 shows a flow chart for a method for operating a magnetic resonance apparatus 10. In a first step 31, reference navigator echos are registered, for example according to the initially cited article by H. A. Ward, for a region of the patient 19 to be imaged, for example the abdominal slice parallel to the x-y-plane. When the method is used for compensating a respiratory movement of the patient 19, a point in time with reference to the respiratory movement, at which the reference navigator echo should be registered, can be arbitrarily defined. In a subsequent step 32 and within the framework of a sequence, for example the gradient echo sequence shown in FIG. 2, a radio-frequency excitation is implemented and this is followed in a step 33 with the acquisition of data of the abdominal slice. A first row of a two-dimensional k-space matrix appertaining to the abdominal slice is thereby occupied.

Before a further radio-frequency excitation is implemented in the step 37 and before a further data acquisition for occupying a further row of the k-space matrix is implemented in the step 38, a check is made in steps 34 through 36 to determine whether a deformation of the abdominal slice and/or a positional change of the abdominal slice as a rigid body has occurred relative to the imaging volume 18. As warranted, the reaction thereto is an adaptation of the location coding for avoiding motion artifacts in the magnetic resonance image of the abdominal slice. To that end, navigator echos are registered from the region to be imaged in step 34, these navigator echos being registered with an invariable location coding with respect to the reference navigator echos. By comparing the navigator echos to the referenced navigator echos, a deformation of the region to be imaged and/or a positional change of the region to be imaged between the registration points in time is identified.

When, for example, an elongation or a compression of the abdominal slice has been found as a deformation in step 35, then the location coding is correspondingly adapted in step 36 before the further radio-frequency excitation and data acquisition of steps 37 and 38, so that a magnetic resonance image of the abdominal slice without motion artifacts is obtained without a subsequent correction. This adaptation of the location coding is described in greater detail in FIG. 4. If, by contrast, no deformation and/or no positional change was/were detected in step 35, then the procedure is continued with an unmodified location encoding, apart from the phase code gradient $G_x$ to be modified in terms of its intensity. The steps 34 through 38 are thereby repeated until all rows of the k-space matrix are completely occupied.

In another embodiment, deformations and/or positional changes are acquired that are not coupled to each radio-frequency excitation; rather, for example comparable to the procedure in functional magnetic resonance imaging, completely occupied two-dimensional or three-dimensional image data sets are acquired between the exposures. The method also can be used in profusion imaging and diffusion imaging.

Figure 4:
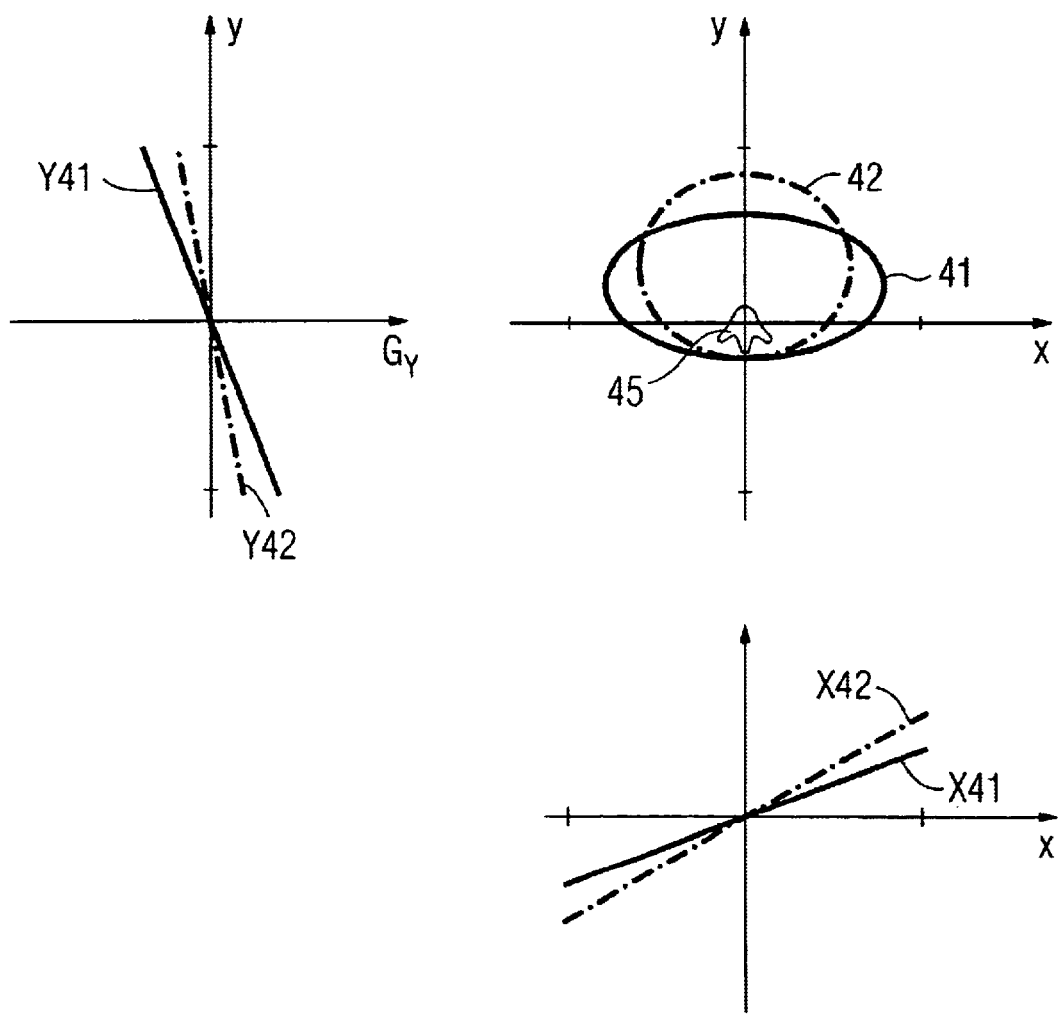
FIG. 4 illustrates an adaptation of location coding in accordance with the invention, given an elongation or compression of a region to be imaged.

As an exemplary embodiment of the invention, FIG. 4 shows an adaptation of a location coding as a consequence of an elongation or compression of the abdominal slice. For a simple presentation and explanation, it is assumed that the abdominal slice as a whole does not experience any translational movement and any rotational movement, in the sense of a rigid body movement.

In different respiratory states of the patient 19, the abdominal slice has respective cross-sections 41 and 42. For the cross-section 41 of the abdominal slice, a first row of the k-space matrix is acquired according to the gradient echo sequence of FIG. 2. The gradient field intensity of the phase coding gradient $G_x$, or of the frequency coding gradient $G_y$, for example corresponding to the gradient pulses X2 and Y2, respectively, has a topical coarse X41 with reference to the x-direction or Y41 with respect to the y-direction. A further row of the k-space matrix is to be acquired for the cross-section 42 of the abdominal slice. The deformation of the abdominal slice from the cross-section 41 to the cross-section 42 is detected with the navigator echo technique. The two cross-sections 41 and 42 can thereby be converted into one another—at least to a good approximation—by a linear elongation or compression with respect to a fixed point that remains essentially unmodified in position in the two cross-sections 41 and 42. In particular, a spinal column 45 is suitable as such a fixed point in the axial slice orientation of the abdominal slice. The analogous case applies to sagittal slice orientations. For coronary abdomen exposures, in contrast, particularly the hip joints are particularly suited for this purpose. The spinal column 45 is placed, as the fixed point, in the zero-point of the x-axis and the y-axis merely for a simple presentation and explanation.

For obtaining a magnetic resonance image of the abdominal slice that is free of motion artifacts, the linear part of the elongation or compression is to be compensated by a modified gradient field setting for the acquisition of the further row. The elongation of the abdominal slice in the y-direction, accompanied by a compression in the x-direction, is compensated by a reduction of the gradient intensity of the frequency coding gradient $G_y$ corresponding to a curve Y42 and by an increase in the gradient intensity of the phase code gradient $G_x$ corresponding to the curve X42, respectively in an inverse proportional relationship to the elongation or compression. The topical gradient field strength is linearly scaled with reference to the fixed point. Moreover, the modification of the intensity of the phase coding gradient $G_x$ corresponding to the requirements of the gradient echo sequence shown in FIG. 2 is to be taken into consideration for the further row. The basis for the above compensation is that elongations or compressions of the image space are imaged in a compression or elongation of k-space in an inversely proportional relationship between the image space of the abdominal slice and its k-space matrix according to the rules of Fourier transformation. Since the occupation of k-space matrices can be directly controlled by the gradient fields in magnetic resonance technology, elongations or compressions of the region to be imaged can be directly compensated with a modified gradient field setting.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance apparatus comprising the steps of:

conducting a magnetic resonance scan of a region of an examination subject, said region being subject to deformation during said scan, in a time sequence including generating radio-frequency signals to excite magnetic resonance signals in said region of said examination subject, generating at least one gradient for location coding of said magnetic resonance signals, and generating at least one readout gradient for allowing reception of the location-coded magnetic resonance signals, during said time sequence, identifying said deformation of said region; and during said time sequence, adapting said location coding of said magnetic resonance signals dependent on the identified deformation.

2. A method as claimed in claim 1 comprising the additional step of identifying a positional change of said region of said examination subject during said time sequence in addition to said deformation, and adapting said location coding of said magnetic resonance signals dependent on the identified positional change in addition to the identified deformation.

3. A method as claimed in claim 2 wherein said deformation is a deformation caused by respiration of said subject and wherein said positional change is a positional change caused by respiration of said subject.

4. A method as claimed in claim 2 comprising identifying said deformation and identifying said positional change with a navigator echo technique.

5. A method as claimed in claim 1 wherein said deformation is a deformation caused by respiration of said subject.

6. A method as claimed in claim 1 comprising identifying said deformation with a navigator echo technique.

7. A method as claimed in claim 1 comprising identifying said deformation and adapting said location coding of said magnetic resonance signal at least before each radio-frequency excitation of said region.

8. A method as claimed in claim 1 wherein said deformation comprises a linear deformation relative to a fixed point of said region, selected from the group consisting of a linear elongation and a linear compression.

9. A method as claimed in claim 8 comprising generating said gradient with a gradient field having a gradient field strength, and comprising adapting said location coding of said magnetic resonance signal by linearly scaling said gradient field strength in an inversely proportional relationship to said linear deformation relative to said fixed point.

10. A method as claimed in claim 8 wherein the step of conducting a scan of said region of said examination subject comprises conducting a scan of a slice of said examination subject selected from the group consisting of a sagittal abdominal slice, an axial abdominal slice, a sagittal thorax slice, and a axial thorax slice, and selecting the spinal column of said subject as said fixed point.

11. A method as claimed in claim 8 wherein the step of conducting a scan of said examination subject comprises conducting a scan of a slice of said examination subject selected from the group consisting of a coronary abdominal slice and a coronary thorax slice, and selecting a hip joint of said subject as said fixed point.

* * * * *